(12) United States Patent
Fan et al.

(10) Patent No.: US 10,424,700 B2
(45) Date of Patent: Sep. 24, 2019

(54) LED LAMP SOURCES, AND THE MANUFACTURING METHODS AND THE BACKLIGHT MODULES THEREOF

(71) Applicant: Shenzhen China Star Optoelectronics Technology Co., Ltd., Shenzhen, Guangdong (CN)

(72) Inventors: Yong Fan, Guangdong (CN); Yu-chun Hsiao, Guangdong (CN); Sheng-Jer Chang Chien, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 231 days.

(21) Appl. No.: 15/529,951

(22) PCT Filed: May 17, 2017

(86) PCT No.: PCT/CN2017/084691
§ 371 (c)(1),
(2) Date: May 25, 2017

(87) PCT Pub. No.: WO2018/188151
PCT Pub. Date: Oct. 18, 2018

(65) Prior Publication Data
US 2018/0315903 A1    Nov. 1, 2018

(51) Int. Cl.
*F21V 21/00* (2006.01)
*H01L 33/50* (2010.01)
(Continued)

(52) U.S. Cl.
CPC .......... *H01L 33/507* (2013.01); *G02B 6/0073* (2013.01); *H01L 33/0095* (2013.01);
(Continued)

(58) Field of Classification Search
CPC ... H01L 33/507; H01L 33/0095; H01L 33/54; H01L 33/483; H01L 33/60;
(Continued)

(56) References Cited

U.S. PATENT DOCUMENTS 9,664,844 B2 * 5/2017 Park ..................... F21S 43/15
2008/0283862 A1 * 11/2008 Fujii ..................... H01L 33/486
257/99
(Continued)

FOREIGN PATENT DOCUMENTS

CN        106356442 A    9/2015
CN        204732450 U    9/2015
(Continued)

*Primary Examiner* — Laura K Tso
(74) *Attorney, Agent, or Firm* — Andrew C. Cheng

(57) ABSTRACT

The present disclosure relates to a LED lamp source and the manufacturing method and the backlight module thereof. The LED lamp source includes a substrate and a LED chip, fluorescent adhesive, and a white reflective layer being fixed on the substrate. The fluorescent adhesive encapsulates the LED chip on the substrate, and the white reflective layer is configured for reflecting light beams emitted from the fluorescent adhesive and being radiated on the white reflective layer. A positive projection of the fluorescent adhesive on the substrate is within the positive projection of the white reflective layer on the substrate.

4 Claims, 5 Drawing Sheets

(51) Int. Cl.
  *F21V 8/00* (2006.01)
  *H01L 33/00* (2010.01)
  *H01L 33/48* (2010.01)
  *H01L 33/60* (2010.01)
  *H01L 33/54* (2010.01)

(52) U.S. Cl.
  CPC ............ *H01L 33/483* (2013.01); *H01L 33/54* (2013.01); *H01L 33/60* (2013.01); *H01L 2933/005* (2013.01); *H01L 2933/0041* (2013.01); *H01L 2933/0058* (2013.01)

(58) Field of Classification Search
  CPC ....... H01L 2933/0041; H01L 2933/005; H01L 2933/0058; G02B 6/0073
  USPC ........................................................ 362/612
  See application file for complete search history.

(56) References Cited

U.S. PATENT DOCUMENTS

| | | | | |
|---|---|---|---|---|
| 2009/0296389 | A1* | 12/2009 | Hsu | G02F 1/133603 362/235 |
| 2010/0051984 | A1* | 3/2010 | West | H01L 33/44 257/98 |
| 2011/0291143 | A1* | 12/2011 | Kim | H01L 33/56 257/98 |
| 2012/0261700 | A1* | 10/2012 | Ooyabu | H01L 33/46 257/98 |
| 2015/0069435 | A1* | 3/2015 | Chen | H01L 33/56 257/98 |
| 2018/0123001 | A1* | 5/2018 | Hung | H01L 33/505 |

FOREIGN PATENT DOCUMENTS

| | | |
|---|---|---|
| CN | 105895785 A | 8/2016 |
| JP | 2014158011 A | 8/2014 |

\* cited by examiner

LED LAMP SOURCES, AND THE MANUFACTURING METHODS AND THE BACKLIGHT MODULES THEREOF

BACKGROUND OF THE INVENTION

1. Field of the Invention

The present disclosure relates to display technology, and more particularly to a light emitting diode (LED) and a manufacturing method and a backlight module thereof.

2. Discussion of the Related Art

Four side emission LED is a lamp source, which is formed by coating fluorescent adhesive (a phosphor colloid layer) and a white reflective layer on a flip chip. The LED lamp source forms a rectangular light-emitting surface on a diffusion plate, which is characterized by advantages, such as small dimension and high driving power, and the good local dimming performance may be realized. As such, the high-dynamic range (HDR) may be realized. However, the uniformity of the optical colors of the four side emission LED is not good enough, that is, the In-Bin rate, i.e., light adoption rate of the LED is low, and this leads to high cost of backlight modules of the LED lamp source.

SUMMARY

The present disclosure relates to a LED lamp source and a manufacturing method and a backlight module thereof to enhance the uniformity of the optical color of the four side emission LED. Also, the In-Bin rate of the LED is enhanced, and the cost of the backlight module is reduced.

In one aspect, a light emitting diode (LED) lamp source includes: a substrate and a LED chip, fluorescent adhesive, and a white reflective layer formed on the fluorescent adhesive, the fluorescent adhesive encapsulating the LED chip on the substrate, the white reflective layer being configured for reflecting light beams emitted from the fluorescent adhesive and being radiated on the white reflective layer, a positive projection of the fluorescent adhesive on the substrate is within the positive projection of the white reflective layer on the substrate.

In another aspect, a backlight module includes: a LED lamp source comprising a substrate and a LED chip, fluorescent adhesive, and a white reflective layer formed on the fluorescent adhesive, the fluorescent adhesive encapsulating the LED chip on the substrate, the white reflective layer being configured for reflecting light beams emitted from the fluorescent adhesive and being radiated on the white reflective layer, a positive projection of the fluorescent adhesive on the substrate is within the positive projection of the white reflective layer on the substrate.

In another aspect, a manufacturing method of LED lamp source includes: providing a substrate; configuring a plurality of LED chips on the substrate, and the LED chips are arranged in a matrix; applying a crystal expansion process and a crystal solid process to the LED chips such that any two of adjacent LED chips are fixed on the substrate by a predetermined gap; forming fluorescent adhesive on the substrate for encapsulating the LED chips being applied with the crystal expansion process and the crystal solid process; cutting the fluorescent adhesive and the substrate along a cutting line between two adjacent LED chips to form a plurality of LED units independent from each other; arranging the LED units on a surface, and the LED units are spaced apart from each other; forming a white-ray reflection layer on a side of the fluorescent adhesive arranged with the LED units, and the side facing away the LED chips; cutting the white-ray reflection layer along a cutting line between two adjacent LED units, and a positive projection of the fluorescent adhesive on the substrate is within the positive projection of the white-ray reflection layer on the substrate.

In view of the above, the white reflective layer 14 may reflect the light emitted from the four lateral sides of the LED lamp source 10, which increases the dimension of optical reflection so as to enhance the uniformity of the optical color. Also, the In-Bin rate of the LED is enhanced. In an example, the number of the LED lamp source 10 may be reduced, such that the backlight cost is reduced.

DETAILED DESCRIPTION OF THE EMBODIMENTS

Embodiments of the invention will now be described more fully hereinafter with reference to the accompanying drawings, in which embodiments of the invention are shown.

Figure 1:
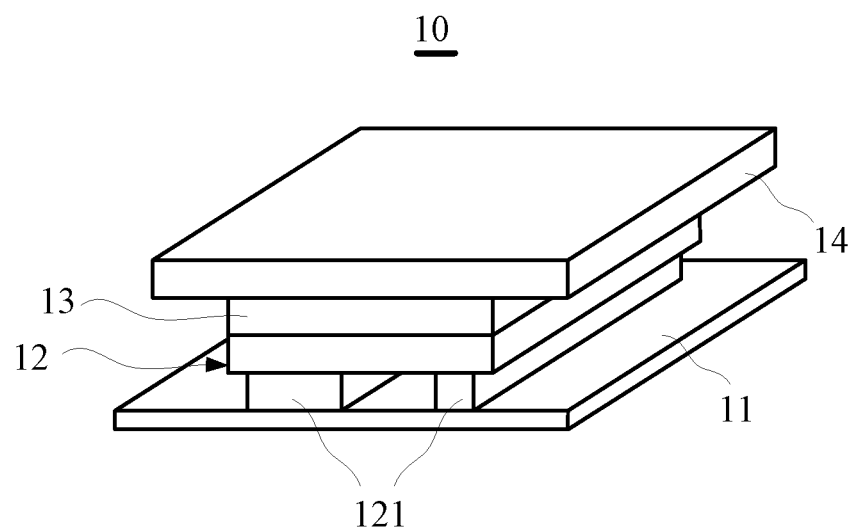
FIG. 1 is a schematic view of the LED lamp source in accordance with one embodiment of the present disclosure.

FIG. 1 is a schematic view of the LED lamp source in accordance with one embodiment of the present disclosure. The LED lamp source 10 includes a substrate 11 and a LED chip 12 fixed on the substrate 11, fluorescent adhesive 13, and a white reflective layer 14 formed on the fluorescent adhesive 13. The substrate 11 may be sapphire. The LED chip 12 is a flip chip configured with a metallic electrode 121, and the LED chip 12 emits blue light when the metallic electrode 121 is electrified. The fluorescent adhesive 13 encapsulates the LED chip 12 on the substrate 11 such that the fluorescent adhesive 13 is a rectangular structure as a whole. As such, the encapsulated LED lamp source 10 is a rectangular structure. The fluorescent adhesive 13 is encapsulation adhesive doped with uniformly distributed fluorescent powders. Yellow light emitted by the fluorescent powders may be compensated with the blue light emitted by the LED chip 12 to form white light. The white reflective layer 14 is formed on one surface of the fluorescent adhesive 13 facing away the LED chip 12, and is configured for reflecting the light beams emitted from the fluorescent adhesive 13 and radiated on the white reflective layer 14.

As the white reflective layer 14 is arranged on a top light-emitting surface of the LED lamp source 10, thus, the white light may be emitted out from four lateral sides of the LED lamp source 10.

Figure 2:
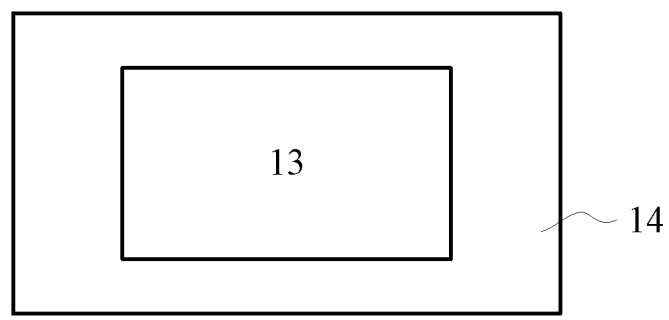
FIG. 2 is a schematic view of the positive projection of the fluorescent adhesive and the white reflective layer of the LED lamp source in FIG. 1.

Compared with the conventional configuration, referring to FIG. 2, the positive projection of the fluorescent adhesive 13 on the substrate 11 is within the positive projection of the white reflective layer 14 on the substrate 11. That is, the dimension of the white reflective layer 14 is greater than the dimension of the fluorescent adhesive 13, wherein the positive projection of the fluorescent adhesive 13 on the substrate 11 may be in a middle portion of the positive projection of the white reflective layer 14 on the substrate 11.

Referring to FIGS. 1 and 2, after the white light is emitted from the fluorescent adhesive 13, the white light is further emitted out via the four lateral sides. A portion of the white reflective layer 14 outside the positive projection of the fluorescent adhesive 13 reflects the white light. After being reflected, the white light arrives the diffusion plate arranged to be close to the substrate 11, and is then emitted out.

It can be conceived that the white reflective layer 14 may reflect the light emitted from the four lateral sides of the LED lamp source 10, which increases the dimension of optical reflection so as to enhance the uniformity of the optical color. Also, the In-Bin rate of the LED is enhanced. In an example, the number of the LED lamp sources 10 may be reduced, such that the backlight cost is reduced.

In an example, the white reflective layer 14 may be a reflective sheet arranged on the fluorescent adhesive 13. In other embodiments, the white reflective layer 14 may be encapsulation adhesive formed on the fluorescent adhesive 13 as long as the encapsulation adhesive close to the surface of the fluorescent adhesive 13 is capable for reflecting the white light.

To further enhance the In-Bin rate of the LED and to enhance the uniformity of the optical color, a surface of the white reflective layer 14 close to the fluorescent adhesive 13 may be a smooth surface. In an example, the reflective sheet close to the fluorescent adhesive 13 may be applied with a mirror process. The surface of the encapsulation adhesive close to the fluorescent adhesive 13 may also be a smooth surface after being applied with a grinding treatment.

Figure 3:
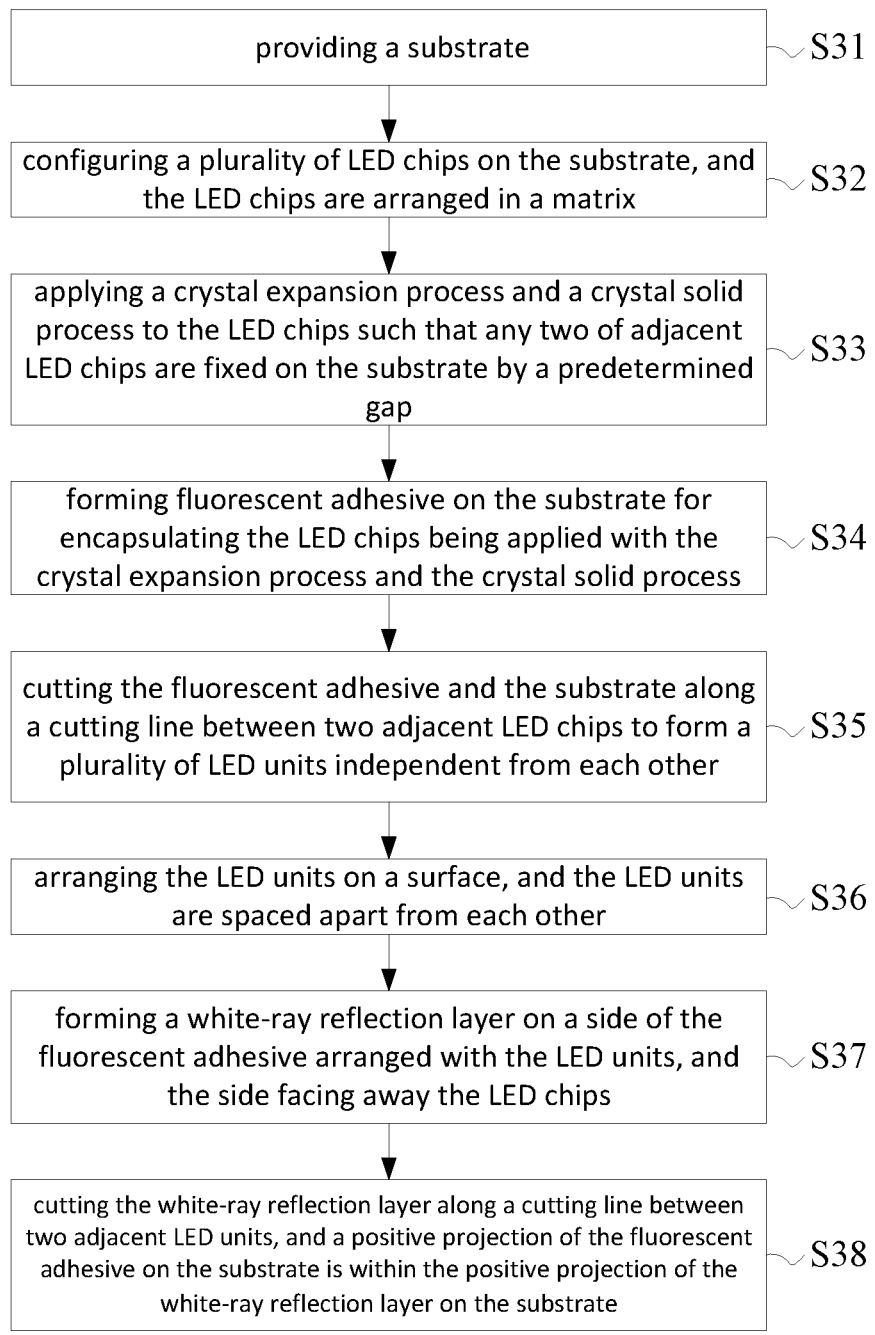
FIG. 3 is a flowchart of the manufacturing method of the LED lamp sources in accordance with one embodiment of the present disclosure.
Figure 4:
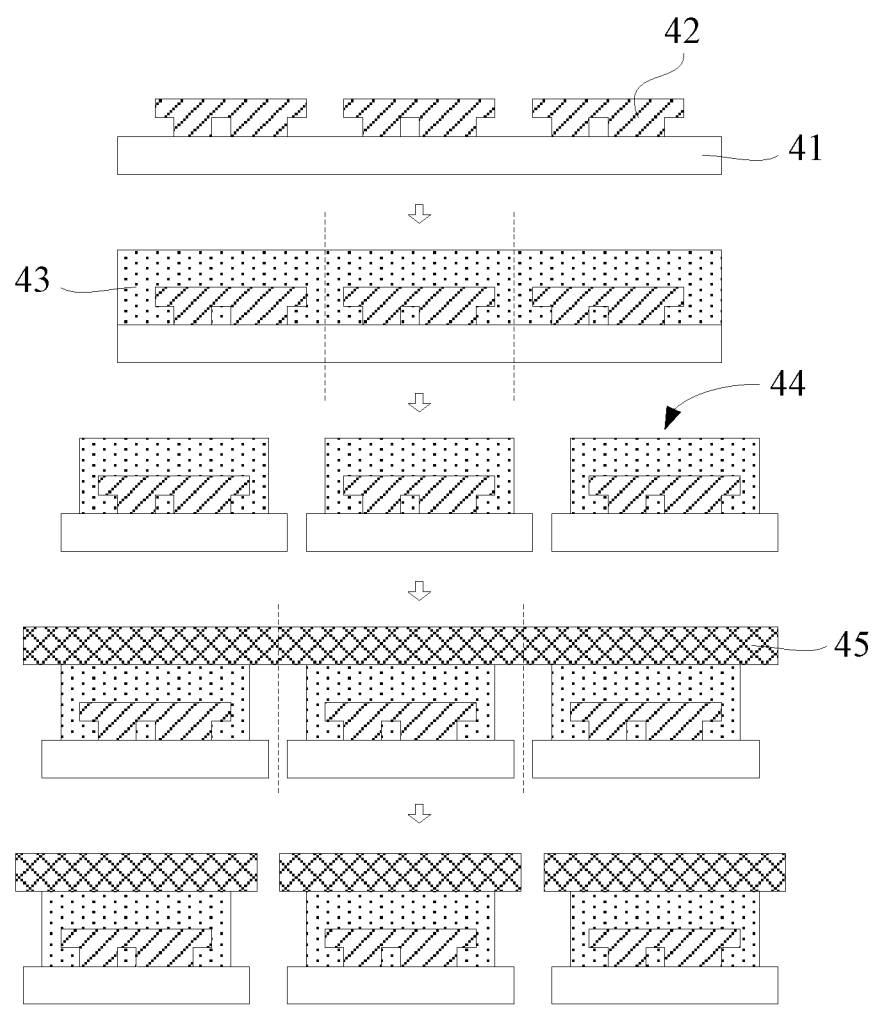
FIG. 4 is a schematic view of the LED lamp source manufactured by the manufacturing method in FIG. 3.

FIGS. 3 and 4 illustrate a manufacturing method of the LED lamp source in accordance with one embodiment of the present disclosure. The method includes steps S31~S38.

In step S31, providing a substrate 41.

In step S32, configuring a plurality of LED chips 42 on the substrate 41, and the LED chips 42 are arranged in a matrix.

In step S33, applying a crystal expansion process and a crystal solid process to the LED chips 42 such that any two of adjacent LED chips 42 are fixed on the substrate 41 by a predetermined gap.

Referring to FIG. 4, the crystal expansion process may configure the gap between the two adjacent LED chips 42, and the crystal solid process may fix the LED chips 42 on the substrate 41 by the predetermined gap.

In step S34, forming fluorescent adhesive 43 on the substrate 41 for encapsulating the LED chips 42 applied with the crystal expansion process and the crystal solid process.

In the embodiment, the fluorescent adhesive 43 encapsulating the LED chips 42 may be formed by a coating and curing process. In other embodiments, formulated fluorescent solution may be formulated by diluting fluorescent gel with toluene or xylene. Afterward, the fluorescent solution is sprayed onto the solidified LED chip 42 using an atomizing spray apparatus. In the presence of air and gravity, the remaining fluorescent particles are uniformly adsorbed on the surface of the LED chip 42. After being baked at a high temperature, for example, at 80 to 120 Celsius for 1 to 2 hours, the particles are cured.

In step S35, applying a cutting process to cut the fluorescent adhesive 43 and the substrate 41 along a cutting line between two adjacent LED chips 42 to form a plurality of LED units independent from each other.

The cutting line may be a central axis between two adjacent LED chips 42.

In step S36, arranging the LED units 44 on a surface, and the LED units 44 are spaced apart from each other.

In step S37, forming a white-ray reflection layer 45 on a side of the fluorescent adhesive 43 being arranged with the LED units 44 and facing away the LED chip 42.

In step S38, applying the cutting process to the white-ray reflection layer 45 along the cutting line between two adjacent LED units 44, and a positive projection of the fluorescent adhesive 43 on the substrate 41 is within the positive projection of the white-ray reflection layer 45 on the substrate 41.

The cutting line may be a center axis between two adjacent LED units 44.

Figure 5:
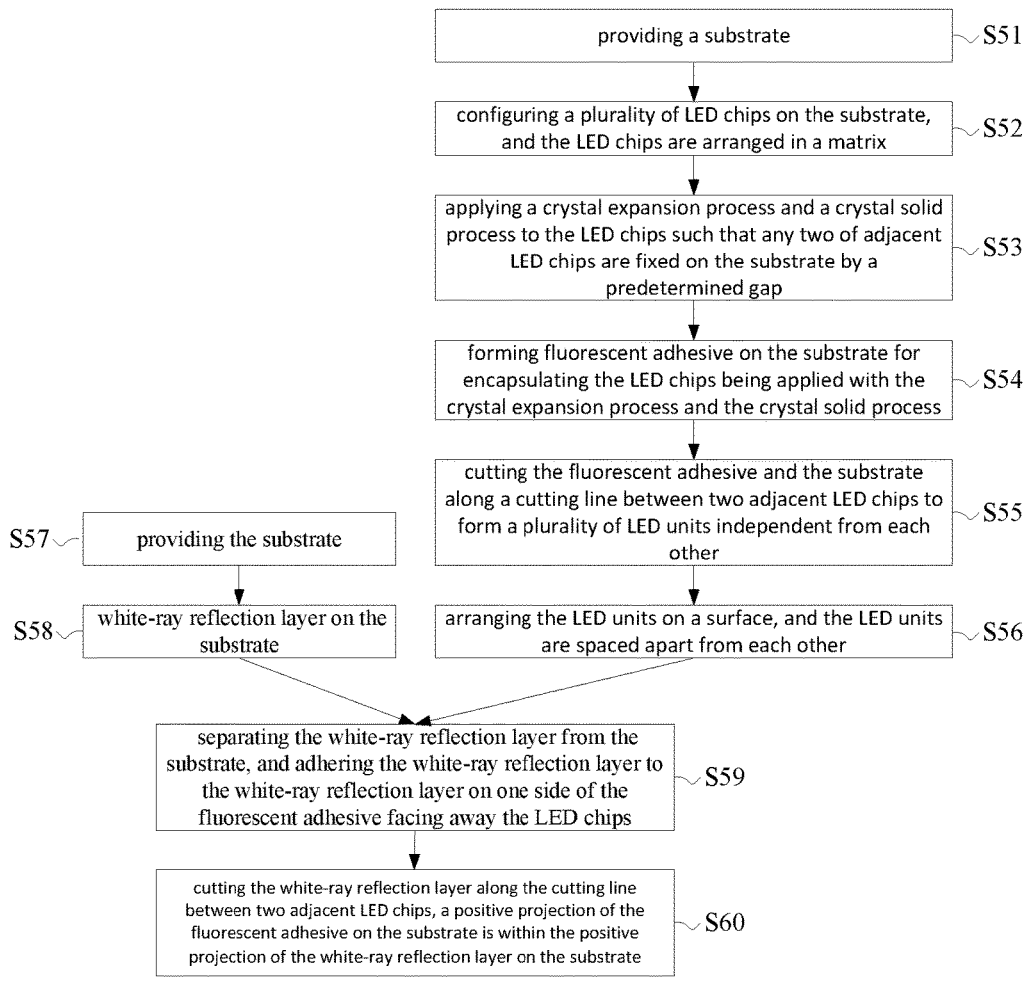
FIG. 5 is a flowchart illustrating the manufacturing method of the LED lamp source in accordance with another embodiment of the present disclosure.
Figure 6:
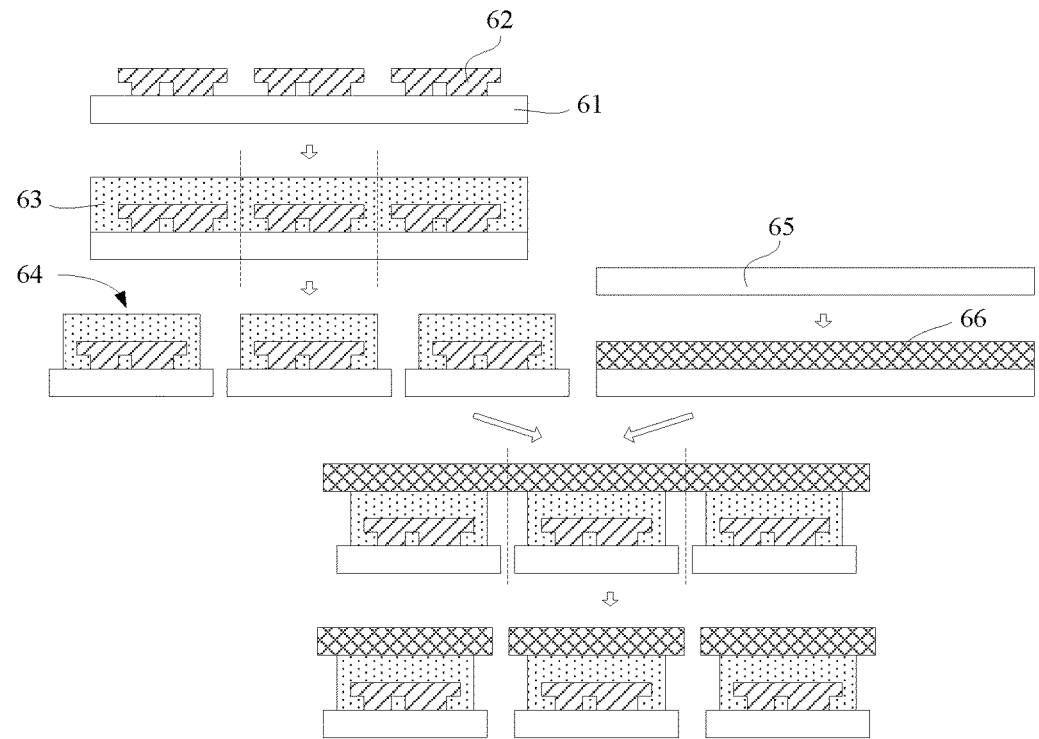
FIG. 6 is a schematic view of the LED lamp source manufactured by the manufacturing method in FIG. 5.

FIGS. 5 and 6 illustrate a manufacturing method of LED lamp source in accordance with another embodiment of the present disclosure. The method may include the following steps.

In step S51, providing a substrate 61.

In step S52, configuring a plurality of LED chips 62 on the substrate 61, and the LED chips 62 are arranged in a matrix.

In step S53, applying a crystal expansion process and a crystal solid process to the LED chips 62 such that any two of adjacent LED chips 62 are fixed on the substrate 61 by a predetermined gap.

In step S54, forming fluorescent adhesive 63 on the substrate 61 for encapsulating the LED chips 62 being applied with the crystal expansion process and the crystal solid process.

In step S55, applying a cutting process to cut the fluorescent adhesive 63 and the substrate 61 along a cutting line between two adjacent LED chips 42 to form the LED units 64 independent from each other.

In step S56, arranging a plurality of LED units 64 on a surface, and the LED units 64 are spaced apart from each other.

In step S57, providing the substrate 65.

In step S58, forming a white-ray reflection layer 66 on the substrate 65.

In the embodiment, the encapsulation adhesive may be formed on the substrate 65, and the encapsulation adhesive is cured to formed the white-ray reflection layer 66.

In step S59, separating the white-ray reflection layer 66 from the substrate 65, and adhering the white-ray reflection layer 66 on one side of the fluorescent adhesive 63 facing away the LED chips 62, and the fluorescent adhesive 63 is arranged with the LED units 64 spaced apart from each other.

Before separating the white-ray reflection layer 66 from the substrate 65, the surface of the white-ray reflection layer 66 facing away the substrate 65 may be applied with the mirror process to enhance the reflection capability of the surface with respect to the white rays. Afterward, the surface of the substrate white-ray reflection layer 66 being applied with the mirror process is adhered to the surface of the fluorescent adhesive 63 facing away the LED chips 62.

In step S60, cutting the white-ray reflection layer 66 along the cutting line between two adjacent LED chips 62. A positive projection of the fluorescent adhesive 43 on the substrate 61 is within the positive projection of the white-ray reflection layer 65 on the substrate 61.

The difference between FIG. 5 and FIG. 3 resides in that: in FIG. 5, the white-ray reflection layer 66 is manufactured on the whole substrate 65, and thus the thickness is uniform. In addition, the surface of the white-ray reflection layer 66 facing toward the fluorescent adhesive 63 may be easily applied with a grinding process so as to obtain a smooth surface.

It can be understood that, in other embodiments, the surface of the fluorescent adhesive 63 facing away the LED chip 62 may be attached with the white-ray reflective sheet to form the white-ray reflection layer 66.

The methods described in FIGS. 3 and 5 may be adopted to manufacture the LED lamp source 10 in FIG. 1.

Figure 7:
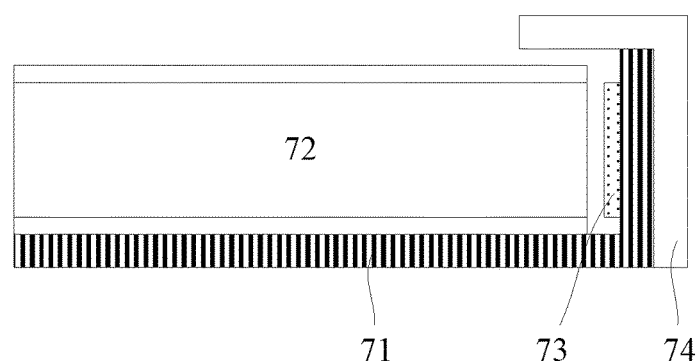
FIG. 7 is a cross section view of the backlight module in accordance with one embodiment of the present disclosure.

FIG. 7 is a cross section view of the backlight module in accordance with one embodiment of the present disclosure. The backlight module 70 is an edge-type backlight module, including a back frame 71, a light guiding plate 72, a backlight source 73, and a plastic frame 74. The back frame 71 includes a carrying portion and a bending portion perpendicular to the carrying portion. The carrying portion is configured to carry the light guiding plate 72. A lateral side of the light guiding plate 72 is a light incident surface, which is vertical to the light-emitting surface. The light incident surface of the light guiding plate 72 is adjacent to the bending portion of the back frame 71. The backlight source 73 is arranged on one surface of the light guiding plate 72 facing toward the light guiding plate 72. The plastic frame 74 includes a body and an extending portion perpendicular to the body. The body is configured to carry the liquid crystal panel, and the extending portion is fixed with the bending portion of the back frame 71.

The backlight source 73 adopts the LED lamp source 10 in FIG. 1. The optical performance of the LED lamp source 10 is uniform, and the in-bin rate of the LED is enhanced. In the embodiment, the backlight module 70 may increase the distance between the LED lamp sources 10 greatly. As such, the number of the backlight sources 73 is reduced, so as the cost of the backlit.

It can be understood that the LED lamp source 10 may also be adopted in the direct-lit backlight module. That is, the LED lamp source 10 is configured between the back frame 71 and a bottom of the light guiding plate 72. Under the circumstance, the bottom of the light guiding plate 72 is the light incident surface, and is opposite to the light-emitting surface.

It is to be noted that the LED lamp source 10 may be adopted in other different backlight modules, and the embodiment in FIG. 7 is only an example.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A light emitting diode (LED) lamp source, comprising:
    a substrate and a LED chip fixed on the substrate, fluorescent adhesive, and a white reflective layer formed on the fluorescent adhesive, the fluorescent adhesive encapsulating the LED chip on the substrate, the white reflective layer being configured for reflecting light beams emitted from the fluorescent adhesive and being radiated on the white reflective layer, a positive projection of the fluorescent adhesive on the substrate is within the positive projection of the white reflective layer on the substrate.

2. The LED lamp source as claimed in claim 1, wherein the white reflective layer comprises a reflective sheet or encapsulation adhesive formed on the fluorescent adhesive.

3. A backlight module, comprising:
    a LED lamp source comprising a substrate and a LED chip fixed on the substrate, fluorescent adhesive, and a white reflective layer formed on the fluorescent adhesive, the fluorescent adhesive encapsulating the LED chip on the substrate, the white reflective layer being configured for reflecting light beams emitted from the fluorescent adhesive and being radiated on the white reflective layer, a positive projection of the fluorescent adhesive on the substrate is within the positive projection of the white reflective layer on the substrate.

4. The backlight module as claimed in claim 3, wherein the white reflective layer comprises a reflective sheet or encapsulation adhesive formed on the fluorescent adhesive.

\* \* \* \* \*